United States Patent
Yu et al.

(10) Patent No.: US 10,797,164 B2
(45) Date of Patent: Oct. 6, 2020

(54) FINFETS HAVING EPITAXIAL CAPPING LAYER ON FIN AND METHODS FOR FORMING THE SAME

(71) Applicant: Taiwan Semiconductor Manufacturing Company, Ltd., Hsin-Chu (TW)

(72) Inventors: Ming-Hua Yu, Hsin-Chu (TW); Chih-Pin Tsao, Zhubei (TW); Hou-Yu Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 194 days.

(21) Appl. No.: 15/367,871

(22) Filed: Dec. 2, 2016

(65) Prior Publication Data
US 2017/0084725 A1    Mar. 23, 2017

Related U.S. Application Data

(63) Continuation of application No. 14/054,595, filed on Oct. 15, 2013, now Pat. No. 9,520,502.

(51) Int. Cl.
*H01L 29/66* (2006.01)
*H01L 29/78* (2006.01)
*H01L 27/088* (2006.01)
*H01L 21/3065* (2006.01)
*H01L 21/324* (2006.01)
(Continued)

(52) U.S. Cl.
CPC .. *H01L 29/66803* (2013.01); *H01L 21/02634* (2013.01); *H01L 21/26513* (2013.01); *H01L 21/3065* (2013.01); *H01L 21/324* (2013.01); *H01L 21/823431* (2013.01); *H01L 27/0886* (2013.01); *H01L 29/0649* (2013.01); *H01L 29/0653* (2013.01); *H01L 29/1083* (2013.01); *H01L 29/32* (2013.01); *H01L 29/66795* (2013.01); *H01L 29/785* (2013.01); *H01L 29/7831* (2013.01); *H01L 29/7851* (2013.01); *H01L 29/7853* (2013.01); *H01L 29/66545* (2013.01)

(58) Field of Classification Search
CPC ..... H01L 21/823431; H01L 21/823821; H01L 21/845; H01L 127/0886; H01L 127/0924; H01L 21/823412; H01L 21/823807; H01L 21/265–26513; H01L 27/0886; H01L 27/0924; H01L 27/10826; H01L 27/10879; H01L 27/1211; H01L 29/41791; H01L 29/66795–66818; H01L 29/785–7856; H01L 2029/7857–7858
See application file for complete search history.

(56) References Cited

U.S. PATENT DOCUMENTS

2005/0077553 A1    4/2005    Kim
2008/0079076 A1*   4/2008    Sheen ............... H01L 29/66795
                                                                257/349
(Continued)

*Primary Examiner* — Kevin Parendo
(74) *Attorney, Agent, or Firm* — Slater Matsil, LLP

(57) ABSTRACT

A FinFET and methods for forming a FinFET are disclosed. A method includes forming a semiconductor fin on a substrate, implanting the semiconductor fin with dopants, and forming a capping layer on a top surface and sidewalls of the semiconductor fin. The method further includes forming a dielectric on the capping layer, and forming a gate electrode on the dielectric.

20 Claims, 5 Drawing Sheets

(51) Int. Cl.
*H01L 21/8234* (2006.01)
*H01L 29/06* (2006.01)
*H01L 29/10* (2006.01)
*H01L 21/02* (2006.01)
*H01L 21/265* (2006.01)
*H01L 29/32* (2006.01)

(56) References Cited

U.S. PATENT DOCUMENTS

| | | |
|---|---|---|
| 2010/0276761 A1 | 11/2010 | Tung et al. |
| 2011/0171795 A1 | 7/2011 | Tsai et al. |
| 2011/0210404 A1* | 9/2011 | Su .................. H01L 29/785 257/401 |
| 2012/0319211 A1 | 12/2012 | van Dal et al. |
| 2013/0056795 A1 | 3/2013 | Wu et al. |
| 2013/0113026 A1 | 5/2013 | Huang et al. |
| 2013/0234204 A1 | 9/2013 | Kang et al. |
| 2013/0270641 A1 | 10/2013 | Chi |
| 2014/0106523 A1 | 4/2014 | Koldiaev et al. |
| 2014/0231914 A1 | 8/2014 | Chang et al. |

\* cited by examiner

US 10,797,164 B2

FINFETS HAVING EPITAXIAL CAPPING LAYER ON FIN AND METHODS FOR FORMING THE SAME

PRIORITY CLAIM AND CROSS-REFERENCE

This application is a continuation of U.S. patent application Ser. No. 14/054,595, entitled "FinFETs having Epitaxial Capping Layer on Fin and Methods for Forming the Same," filed on Oct. 15, 2013, which application is hereby incorporated herein by reference.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits typically include field-effect transistors (FETs).

Conventionally, planar FETs have been used in integrated circuits. However, with the ever increasing density and decreasing footprint requirements of modern semiconductor processing, planar FETs may generally incur problems when reduced in size. Some of these problems include sub-threshold swing degradation, significant drain induced barrier lowering (DIBL), fluctuation of device characteristics, and leakage. Fin field-effect transistors (FinFETs) have been studied to overcome some of these problems.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Fin Field-Effect Transistors (FinFETs) and methods of forming the same are provided in accordance with various embodiments. The intermediate stages of forming the Fin-FETs are illustrated. Some variations of the embodiments are discussed. Throughout the various views and illustrative embodiments, like reference numbers are used to designate like elements. Although method embodiments are discussed in a particular order, various other method embodiments may be performed in any logical order and may include fewer or more steps described herein.

Figure 1:
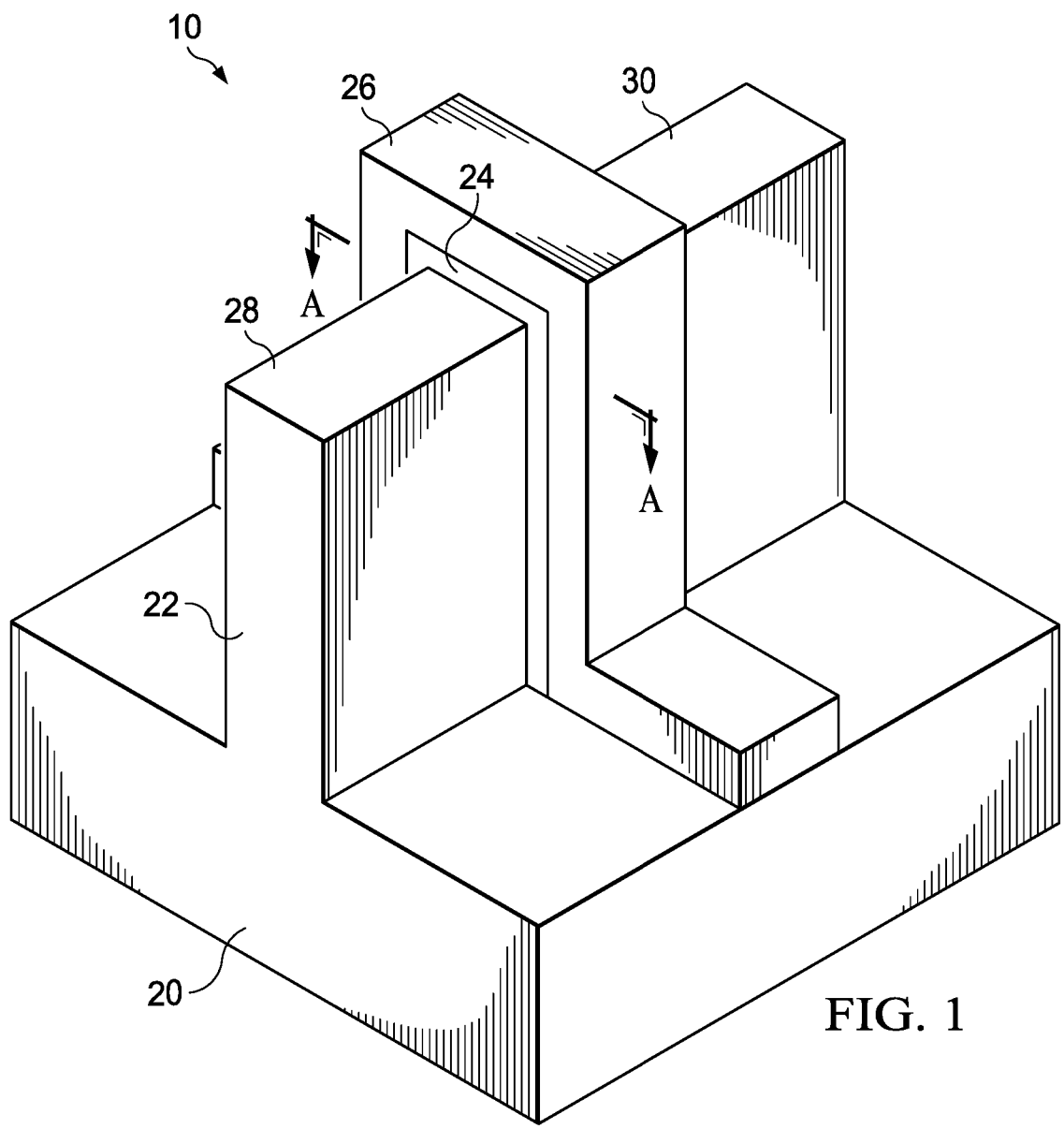
FIG. 1 is an example of a fin field-effect transistor (FinFET) in a three-dimensional view.

FIG. 1 illustrates an example of a FinFET 10 in a three-dimensional view. The FinFET 10 comprises a fin 22 on a substrate 20. A gate dielectric 24 is along sidewalls and over a top surface of the fin 22, and a gate electrode 26 is over the gate dielectric 24. The source/drain regions 28 and 30 are disposed in opposite sides of the fin 22 with respect to the gate dielectric 24 and the gate electrode 26. FIG. 1 further illustrates a reference cross-section that is used in later figures. Cross-section A-A is across the fin 22 in a channel region (not shown), the gate dielectric 24, and the gate electrode 26 of the FinFET 10.

Figure 2A:
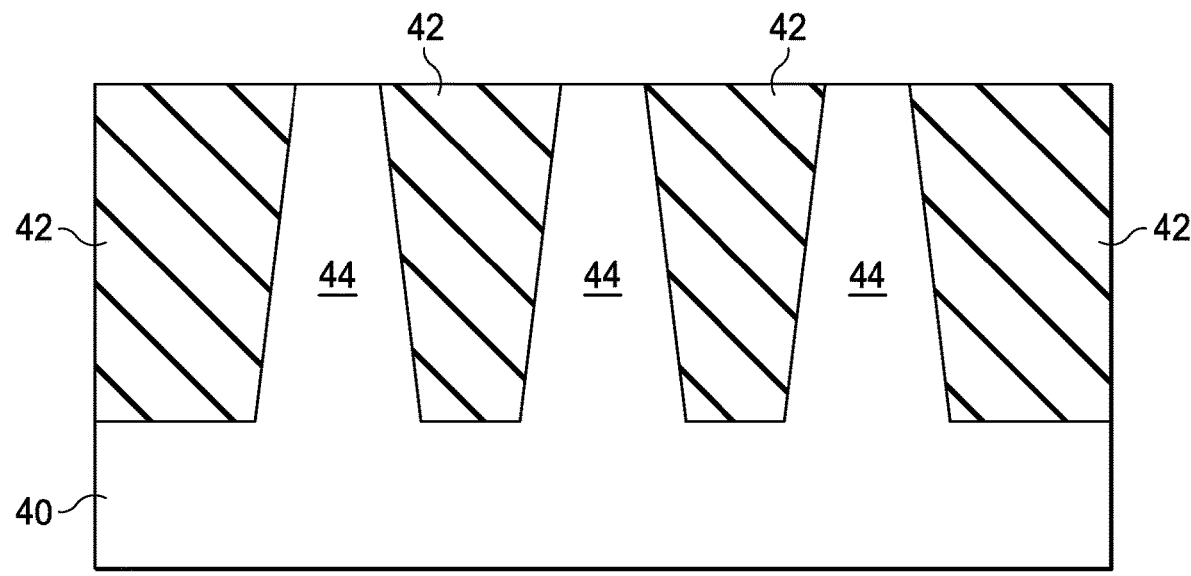
FIGS. 2A, 2B, 2C, 2D, 2E, and 2F are cross-sectional views of intermediate stages in the manufacturing of a FinFET in accordance with an embodiment.
Figure 2B:
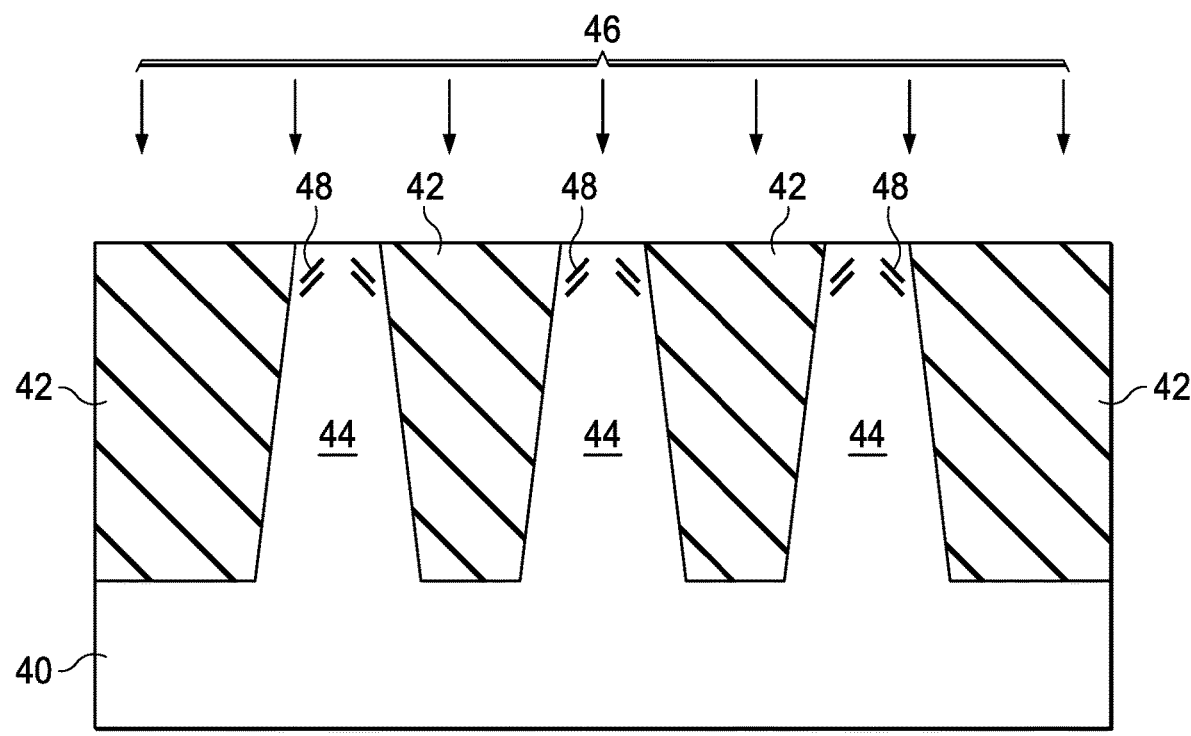
Figure 2C:
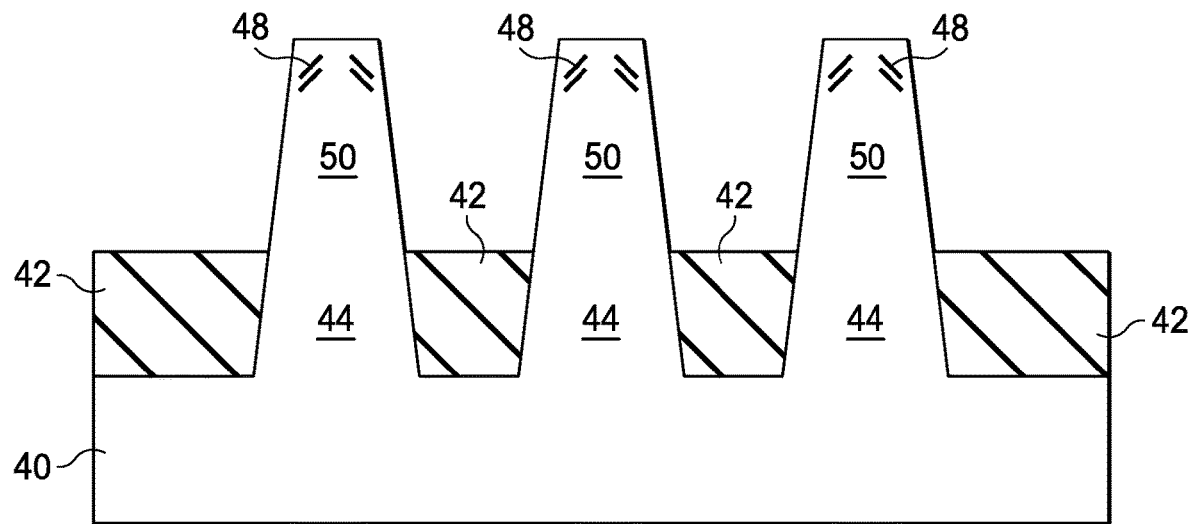
Figure 2D:
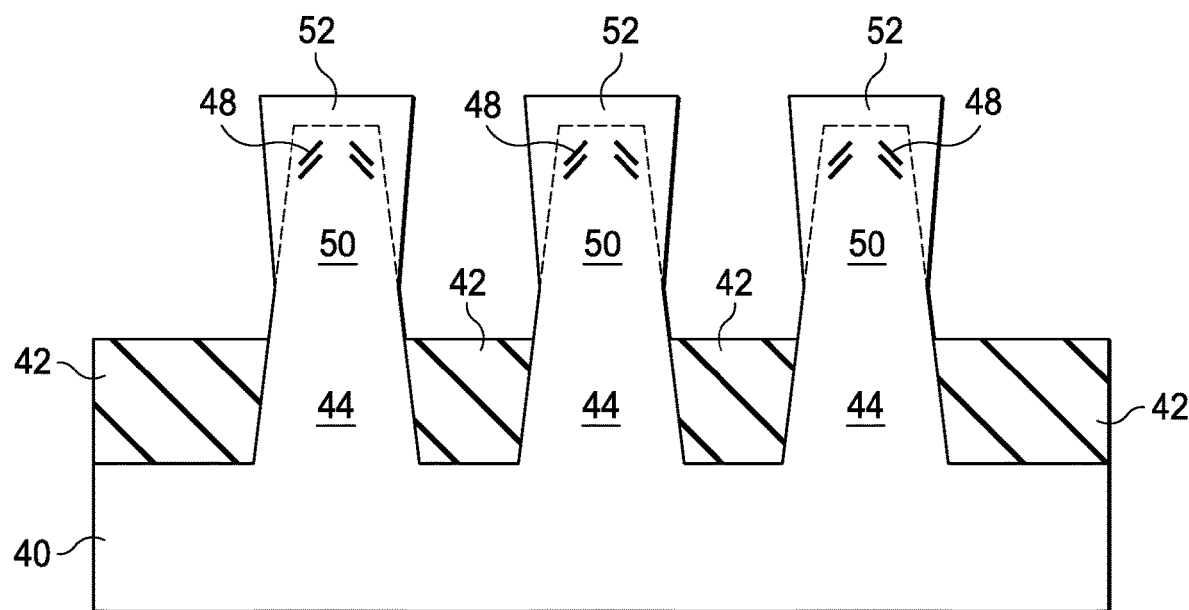
Figure 2E:
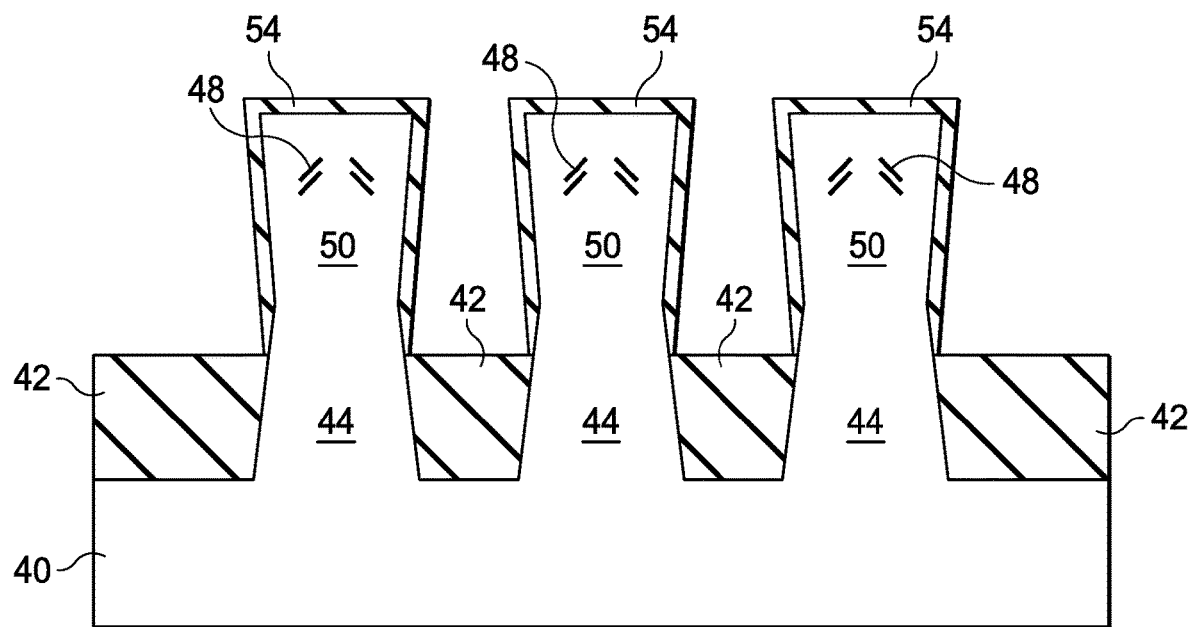
Figure 2F:
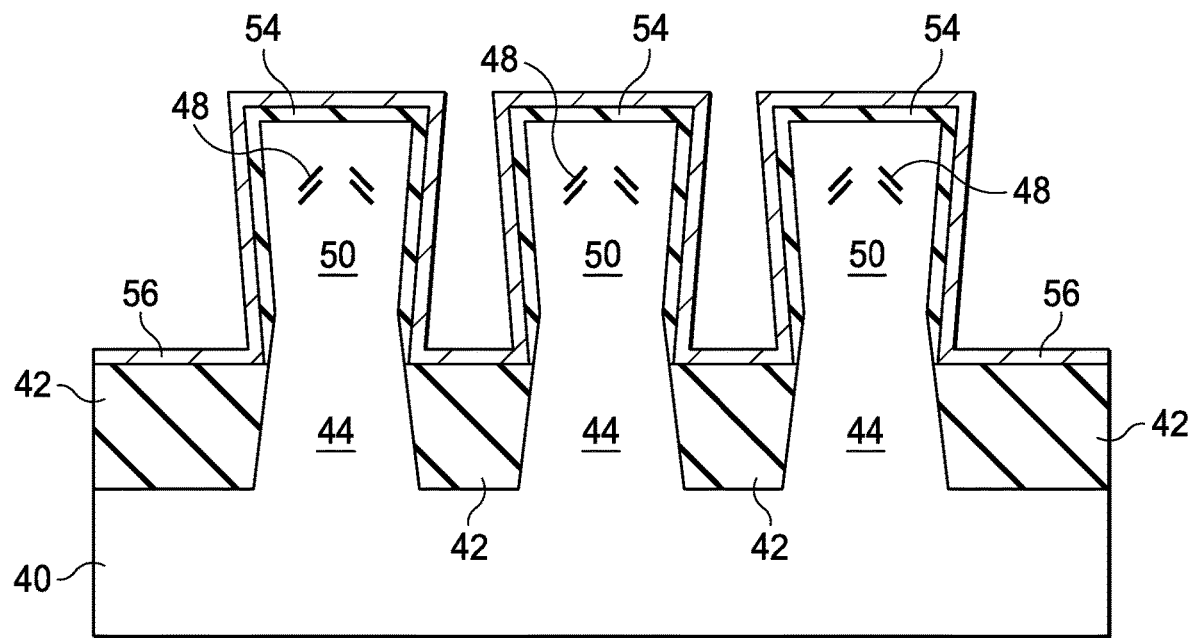
Figure 3:
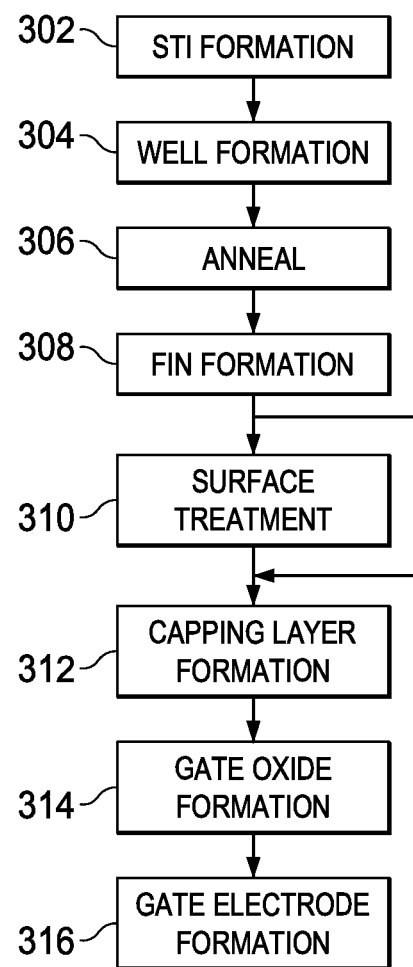
FIG. 3 is a process flow of the process shown in FIGS. 2A through 2F in accordance with an embodiment.

FIGS. 2A through 2F are cross-sectional views of intermediate stages in the manufacturing of a FinFET in accordance with an embodiment, and FIG. 3 is a process flow of the process shown in FIGS. 2A through 2F. FIGS. 2A through 2F illustrate cross-section A-A illustrated in FIG. 1, except for FIGS. 2A through 2F illustrate multiple fins 50.

FIG. 2A illustrates a substrate 40, which may be a part of a wafer. The substrate 40 may comprise a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 40 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 40 may be doped with a p-type dopant, such as boron, aluminum, gallium, or the like, although the substrate may alternatively be doped with an n-type dopant, as is known in the art.

The substrate 40 may include active devices (not shown in FIG. 2A). As one of ordinary skill in the art will recognize, a wide variety of devices such as transistors, capacitors, resistors, combinations of these, and the like may be used to generate the structural and functional requirements of the design for the FinFET. The devices may be formed using any suitable methods. Only a portion of the substrate 40 is illustrated in the figures, as this is sufficient to fully describe the illustrative embodiments.

Semiconductor strips 44 and isolation regions 42 are formed over the substrate 40 (step 302). The isolation regions 42 extend from a top surface of the substrate 40 into the substrate 40. The isolation regions 42 may be Shallow Trench Isolation (STI) regions, and are referred to as STI regions 42 hereinafter. The formation of the STI regions 42 may include etching the substrate 40 to form trenches (not shown), and filling the trenches with a dielectric material to form the STI regions 42. The STI regions 42 may be formed of silicon oxide deposited by a high density plasma, for example, although other dielectric materials formed according to various techniques may also be used. The portion of substrate 40 between neighboring STI regions 42 is referred to as a semiconductor strip 44 throughout the description. The top surfaces of the semiconductor strips 44 and the top surfaces of the STI regions 42 may be substantially level with each other, such as by performing a chemical mechanical polish (CMP) after depositing the material of the STI regions 42, although the surfaces may be at slightly different levels.

FIG. 2B illustrates the formation of a well region (step 304). The well region is formed by implanting the semiconductor strips 44 with dopants in an implant 46. In some embodiments, a photoresist (not shown) is formed over the semiconductor strips 44 and the STI regions 42 in the substrate 40. The photoresist is then patterned to expose a portion of the substrate 40 that is intended to be implanted with the dopants, such as an NMOS or PMOS region. In an embodiment with an NMOS region, a p-type impurity implant 46 is performed, and the photoresist may act as a mask to substantially prevent the p-type impurities from being implanted into other regions, such as an adjacent PMOS region. The p-type impurities may be boron, $BF_2$, or the like, and may be implanted to a concentration of equal to or less than $10^{19}$ cm$^{-3}$, such as between about $10^{17}$ cm$^{-3}$ and about $10^{18}$ cm$^{-3}$. In an embodiment with a PMOS region, an n-type impurity implant 46 is performed, and the photoresist may act as a mask to substantially prevent the n-type impurities from being implanted into other regions, such as an adjacent NMOS region. The n-type impurities may be phosphorus, arsenic, or the like, and may be implanted to a concentration of equal to or less than $10^{19}$ cm$^{-3}$, such as between about $10^{17}$ cm$^{-3}$ and about $10^{18}$ cm$^{-3}$. After the implant 46, the first photoresist may be removed, such as by an acceptable ashing process.

In some embodiments, the formation of the well region includes multiple implanting processes. In an embodiment, a first implant process is a pre-amorphization implant (PAI) process, thereby creating a PAI implant region in the semiconductor strips 44. This PAI process has been found to retard the diffusion of a subsequent implant, such as p-type impurity implant discussed above. In this embodiment, the first implant process may utilize any suitable implant material, such as germanium, carbon, fluorine, indium, the like, or combination thereof. After the first implant process, a second implant process is performed, such as the p-type or n-type impurity implants 46 discussed above, to implant p-type or n-type dopants into the PAI implant region to form co-implant regions.

After the implant 46 in FIG. 2B, an anneal may be performed (step 306) to activate the p-type and/or n-type impurities that were implanted. The implantations may form a p-well in an NMOS region and an n-well in a PMOS region.

As illustrated in FIG. 2B, the implant 46 and anneal process form twin plane defects 48 in the semiconductor strips 44. The twin plane defects 48 occur due to the damage caused by the implant step 46 near the narrow top surface of the semiconductor strips 44. In some embodiments, the surface of the substrate has a (001) crystalline orientation and the twin plane defects occur at a (111) crystalline orientation as the (111) plane. For example, due to the 3D nature of the semiconductor strips 44, the re-crystallization in the semiconductor strip 44 structure will have more than one moving regrowth front. In addition, as different silicon crystalline orientations have different regrowth rates and also due to the presences of the semiconductor strip 44 surfaces, the regrowth may occur along an interface rather than terminating at one. Further, the presence of the rough surfaces of semiconductor strips 44 due to the etch process can hinder the templated atom incorporation in the crystalline lattice, and (111) defects may occur.

In FIG. 2C, the STI regions 42 are recessed such that respective fins 50 protrude from between neighboring STI regions 42 to form the fins 50 (step 308). The STI regions 42 may be recessed using an acceptable etching process, such as one that is selective to the material of the STI regions 42. For example, a chemical oxide removal using a Tokyo Electron CERTAS or an Applied Materials SICONI tool or dilute hydrofluoric acid may be used.

A person having ordinary skill in the art will readily understand that the process described with respect to FIGS. 2A through 2C is just one example of how fins 50 may be formed. In other embodiments, a dielectric layer can be formed over a top surface of the substrate 40; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the semiconductor strips 44 in FIG. 2A can be recessed, and a material different from the semiconductor strips 44 may be epitaxially grown in their place. In an even further embodiment, a dielectric layer can be formed over a top surface of the substrate 40; trenches can be etched through the dielectric layer; heteroepitaxial structures can be epitaxially grown in the trenches using a material different from the substrate 40; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate the implantations discussed in FIG. 2B although in situ and implantation doping may be used together. Still further, it may be advantageous to epitaxially grow a material in an NMOS region different from the material in a PMOS region. In various embodiments, the fins 50 may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

After the fins 50 are formed, an optional surface treatment process may be performed on the fins 50 (step 310). The surface treatment may repair the damaged surface layer of the fins 50 caused by the prior implanting and etching processes. By having a clean surface with less point defects, the carriers can conduct with higher mobility in the subsequently grown capping layer 52 which may provide a mobility gain to the subsequently formed FinFET. In some embodiments, surface treatment process a dry etch process including etchant gases of HCl, $Cl_2$, the like, or a combination thereof with carrier gases of $H_2$, $N_2$, the like, or a combination thereof. In an embodiment, the surface treatment process is an in-situ gas-phase etching without plasma bombardment or bias voltage. In an embodiment, the dry etch surface treatment process is performed from about 1 minute to about 10 minutes, at a pressure from about 10 Torr to about 100 Torr, and at a temperature from about 600° C. to about 800° C.

In FIG. 2D, a capping layer 52 is formed on the fins 50 (step 312). The fins 50 before the formation of the capping layer 52 are shown with dashed lines in FIG. 2D. The capping layer 52 is a thin semiconductor layer and may be formed on a top surface and sidewalls of the fins 50. The capping layer 52 may be used to help keep the twin plane defects 48 from interrupting the current flow as the capping layer 52 buries the twin plane defects 48 within the fin 50. By burying the twin plane defects 48, the effects of the twin plane defects 48 on the current flow is reduced if not eliminated as most of the current flows near the surface of the fin 50 within the capping layer 52. In addition, the capping layer 52 provides a low coulomb scatter environment for the current to flow within, which may result in a mobility gain for the FinFET. In an embodiment, the capping layer 52 is formed in a same process chamber as the optional surface treatment process and the substrate 40 and fins 50 are not exposed to an external environment (in-situ) between these processes to prevent oxidation and/or contamination of the fins 50 between the surface treatment and the formation of the capping layer 52.

In some embodiments, the capping layer 52 is formed to have a thickness in a range from about 1 nm to about 6 nm. In an embodiment, the capping layer 52 is formed to have a thickness from about 2 nm to about 6 nm. The capping layer 52 may be formed having a same material composition as the material composition of the fins 50. In an embodiment, the capping layer 52 is a homoepitaxial structure epitaxially grown on the top surface and sidewalls of the fins 50. In another embodiment, the capping layer 52 is a heteroepitaxial structure epitaxially grown on the top surface and sidewalls of the fins 50. The formation methods of the capping layer 52 may include atomic layer deposition (ALD), chemical vapor deposition (CVD), such as a reduced pressure CVD (RPCVD), metalorganic chemical vapor deposition (MOCVD), other applicable methods, or a combination thereof. Depending on the desirable composition of the capping layer 52, the precursors for the epitaxial may include Si-containing gases, Ge-containing gases, and/or P-containing gases, such as $SiH_4$, $GeH_4$, and $PH_3$, and/or the like, and the partial pressures of the Si-containing gases, Ge-containing gases, and P-containing gases are adjusted to modify the atomic ratio of germanium/phosphorous to silicon. In an embodiment, the capping layer 52 is doped in-situ as the capping layer 52 material is grown. In another embodiment, the capping layer 52 is doped through an implantation method as discussed above. The in-situ doping of the capping layer 52 provides a more uniform doping than if the capping layer 52 were doped by implantation, which may enhance the performance of the subsequently formed FinFET. The capping layer 52 may be doped with similar dopants as discussed above in the well formation in step 304, such as boron, phosphorous, arsenic, the like, or a combination thereof. In an embodiment, the capping layer 52 is doped with n-type or p-type impurities to have an impurity concentration of equal to or less than $10^{20}$ $cm^{-3}$, such as between about $10^{18}$ $cm^{-3}$ and about $10^{19}$ $cm^{-3}$. In some embodiments, the capping layer 52 is not doped with either n-type or p-type impurities.

In FIG. 2E, a gate dielectric layer (not shown) is formed over the fins 50 (step 314). As illustrated in FIGS. 2E and 2F, the fin 50 includes the capping layer 52 (see FIG. 2D) but the capping layer 52 is not shown as a separate structure. The gate dielectric layer (not shown) will be subsequently patterned to form a gate dielectric 54. The gate dielectric layer may be formed over the fins 50 by thermal oxidation, CVD, a spin-on-glass process, sputtering, or any other methods known and used in the art for forming a gate dielectric layer. In some embodiments, the gate dielectric layer may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or a combination thereof. In other embodiments, the gate dielectric layer includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

After the gate dielectric layer is formed, a gate electrode 56 is formed over the gate dielectric layer (step 316). The gate electrode 56 may be formed by first forming a gate electrode layer (not shown) over the fins 50 and the STI regions 42 and then patterning the gate electrode layer and the gate dielectric layer to form the gate electrode 56 and gate dielectric 54. In some embodiments, the gate electrode layer is a conductive material and may be selected from a group comprising polycrystalline-silicon (poly-Si), polycrystalline silicon-germanium (poly-SiGe), metallic nitrides, metallic silicides, metallic oxides, and metals. In an embodiment, the gate electrode layer includes a metal-containing material such as TiN, TaN, TaC, Co, Ru, Al, combinations thereof, or multi-layers thereof. The gate electrode layer may be deposited by CVD, physical vapor deposition (PVD), sputter deposition, or other techniques known and used in the art for depositing conductive materials. The top surface of the gate electrode layer may have a non-planar top surface and may be planarized by, for example, performing a CMP process after it is deposited. A mask layer (not shown)—such as a photoresist, hard mask, combinations thereof, or multi-layers thereof—may be formed and patterned over the gate electrode layer. The patterned mask layer may then be transferred to the material of the gate electrode layer using acceptable photolithography and etching techniques to form the gate electrode 56 and the gate dielectric 54.

While, the embodiments, described above are described using a "gate-first" approach, such embodiments are not limited solely to gate-first structures. Other embodiments include formation of dummy gates for FinFETs formed using "gate-last" or replacement-gate processes. For example, a dummy gate dielectric and electrode may be formed and then one or more inter-layer dielectrics (ILDs) may be formed over and adjoining the dummy gate electrode. Following subsequent processing, the dummy gate dielectric and electrode may be removed and an active gate dielectric and electrode may be formed in their place.

Although not explicitly shown, a person having ordinary skill in the art will readily understand that further processing steps may be performed on the structure illustrated in FIG. 2F. For example, gate spacers may be formed on sidewalls of the gate electrode 56 and source/drain regions (see source/drain regions 28 and 30 in FIG. 1) may be formed in the fin 50. Further, an etch stop layer (ESL) and an ILD may be formed over and adjoining the gate electrodes 56 and fins 50, and inter-metal dielectrics (IMD) and their corresponding metallizations may be formed over the ESL.

The gate spacers (not shown) may be formed on opposite sides of the gate electrodes 56 (see gate electrode 26 in FIG. 1). The gate spacers are typically formed by blanket depositing a spacer layer (not shown) on the previously formed structure. In an embodiment, the gate spacers may include a spacer liner (not shown) comprising SiN, SiC, SiGe, oxynitride, oxide, combinations thereof, or the like. The spacer layer may comprise SiN, oxynitride, SiC, SiON, oxide, combinations thereof, or the like and may be formed by methods utilized to form such a layer, such as CVD, plasma enhanced CVD, sputter, and other methods known in the art. The gate spacers are then patterned, for example, by anisotropically etching to remove the spacer layer from the horizontal surfaces of the structure.

The source/drain regions (not shown in FIG. 2F, see source/drain regions 28 and 30 in FIG. 1) may be formed in the fins 50. The source/drain regions may be doped by with the appropriate dopants to complement the dopants in the fins 50. In another embodiment, the source/drain regions may be formed by forming recesses in the fins 50 and epitaxially growing material in the recesses. The source/ drain regions may be doped either through an implantation method as discussed above, or else by in-situ doping as the material is grown.

In another embodiment, the source/drain regions may comprise a lightly doped region and a heavily doped region. In this embodiment, before the gate spacers are formed, the source/drain regions may be lightly doped. After the gate spacers are formed, the source/drain regions may then be heavily doped. This forms lightly doped regions and heavily doped regions. The lightly doped regions are primarily underneath the gate spacers while the heavily doped regions are outside of the gate spacers along the fins 50. In some embodiments, the fins 50 include an anti-punch through region (not shown). This anti-punch through region prevents the short channel effect of electrons or holes punching through the channel from the source to the drain. The anti-punch through region may be doped the same as the fin 50 but with a higher dopant concentration.

After the formation of the source/drain regions, an ESL and an ILD may be formed over the gate spacers, the gate electrode 56, the source/drain regions, the fins 50, and the STI regions 42. The ESL may be conformally deposited over components on the substrate 40. In an embodiment, the ESL is formed of SiN, SiCN, SiON, the like, or a combination thereof and is formed by ALD, molecular layer deposition (MLD), a furnace process, CVD, PECVD, the like, or a combination thereof.

After the ESL is formed, the ILD may be formed over the ESL. The ILD may be conformally deposited over the ESL. In an embodiment, the ILD may comprise $SiO_2$, SiON, the like, or a combination thereof. The ILD may be formed by CVD, ALD, PECVD, subatmospheric CVD (SACVD), flowable CVD, a high density plasma (HDP), a spin-on-dielectric process, the like, or a combination thereof.

The ILD may be planarized by using a CMP process to remove portions of the ILD. In other embodiments, other planarization techniques may be used, such as etching. The semiconductor device may undergo further processing such as formation of contacts to the gate electrodes 56 and the source/drain regions.

Various embodiments that have a capping layer on a FinFET may have increased electrical characteristics and performance compared to a conventional FinFET. The well implantation step may causes twin plane defects in the surface of the narrow fin structure. The capping layer may help to keep the twin plane defects from interrupting the current flow as the capping layer buries the twin plane defects within the fin and not having them on the surface of the fin. By burying the twin plane defects, the effects of the twin plane defects on the current flow is reduced if not eliminated as most of the current flows near the surface of the fin within the capping layer. This improved current flow may result in increased mobility gain for the FinFET. In addition, the capping layer provides a low coulomb scatter environment for the current to flow in, which may result in a mobility gain for the FinFET. Hence, in some embodiments where the fin has a capping layer as discussed above, the FinFET can have increased electrical characteristics and performance.

According to an embodiment, a method includes forming a semiconductor fin on a substrate, implanting the semiconductor fin with dopants, and forming a capping layer on a top surface and sidewalls of the semiconductor fin. The method further includes forming a dielectric on the capping layer, and forming a gate electrode on the dielectric.

According to another embodiment, a method includes forming a semiconductor fin on a substrate, forming an isolation region on the substrate, the isolation region surrounding the semiconductor fin, and implanting dopants into the semiconductor fin. The method further includes after implanting dopants into the semiconductor fin, recessing the isolation region to expose an upper portion of the semiconductor fin, and epitaxially growing a capping layer on the upper portion of the semiconductor fin.

According to a further embodiment, a structure includes an isolation region over a substrate, a fin raised above the substrate, the fin having an upper portion extending above a top surface of the isolation region, and a capping layer on a top surface and sidewalls of the upper portion of the fin, a bottom surface of the capping layer adjoining the top surface of the isolation region.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   patterning a semiconductor substrate to form a semiconductor fin on the semiconductor substrate, the patterning forming a top surface and sidewalls of the semiconductor fin, the top surface and the sidewalls of the semiconductor fin having a same material composition;
   forming an isolation region on the semiconductor substrate, the isolation region surrounding the semiconductor fin;
   implanting dopants into the semiconductor fin;
   after implanting dopants into the semiconductor fin, recessing the isolation region to expose an upper portion of the semiconductor fin;
   homoepitaxially growing a capping layer from the top surface and sidewalls of the semiconductor fin, the top surface and the sidewalls of the semiconductor fin being on the upper portion of the semiconductor fin; and
   forming a gate dielectric layer over the capping layer, the gate dielectric layer contacting sidewalls of the capping layer and the semiconductor fin.

2. The method of claim 1, wherein the capping layer has a thickness from 2 nm to 6 nm.

3. The method of claim 1, wherein the dopants comprise boron, phosphorous, arsenic, germanium, carbon, fluorine, indium, or a combination thereof.

4. The method of claim 1, wherein implanting dopants into the semiconductor fin causes twin plane defects in the semiconductor fin.

5. The method of claim 4, wherein the capping layer is grown over the twin plane defects.

6. The method of claim 1 further comprising:
forming a gate dielectric on the capping layer; and
forming a gate electrode on the gate dielectric.

7. The method of claim 1, wherein a bottom surface of the capping layer adjoins a top surface of the isolation region.

8. The method of claim 1 further comprising:
after implanting dopants into the semiconductor fin and before recessing the isolation region, performing an anneal process on the semiconductor fin.

9. The method of claim 1 further comprising:
before homoepitaxially growing the capping layer, performing a dry etch process on the semiconductor fin.

10. A method comprising:
patterning a substrate to form a fin, the patterning forming a top surface and sidewalls of the fin, the top surface and the sidewalls of the fin having a same material composition;
forming an isolation region over the substrate, the isolation region surrounding the fin;
implanting dopants into the fin;
after implanting dopants into the fin, etching the isolation region to expose a first portion of the fin;
treating the first portion of the fin with a dry etch process; and
after treating the first portion of the fin, homoepitaxially growing a capping layer from the top surface and the sidewalls of the first portion of the fin, wherein portions of the capping layer disposed on the sidewalls of the first portion of the fin have a first thickness proximal the substrate and a second thickness distal the substrate greater than the first thickness.

11. The method of claim 10 further comprising:
forming a gate dielectric on the capping layer; and
forming a gate electrode on the gate dielectric.

12. The method of claim 11 further comprising:
forming a source region in the fin; and
forming a drain region in the fin, the source region being on an opposite side of the gate electrode than the drain region, the capping layer extending across the top surface of the fin from the source region to the drain region.

13. The method of claim 10, wherein a bottom surface of the capping layer adjoins a top surface of the isolation region.

14. The method of claim 10, wherein implanting dopants into the fin causes twin plane defects in the fin, the capping layer being grown over the twin plane defects.

15. The method of claim 10 further comprising:
before patterning the substrate to form the fin, doping the substrate with dopants; and
patterning the substrate to form a second fin on the doped substrate, before implanting dopants into the fin, the isolation region surrounding the second fin, the isolation region contacting opposite sidewalls of both the fin and the second fin.

16. The method of claim 10 further comprising:
after implanting dopants into the fin and before etching the isolation region, performing an anneal process on the fin.

17. A method comprising:
patterning a substrate to form a fin, the patterning forming a top surface and sidewalls of the fin, the top surface and the sidewalls of the fin having a same material composition;
forming an isolation region on the substrate, the isolation region surrounding the fin;
implanting the fin with dopants, the implanting the fin with dopants causing twin plane defects in the fin;
after implanting dopants into the fin, recessing the isolation region to expose an upper portion of the fin;
homoepitaxially growing a capping layer from the top surface and the sidewalls of the fin, the capping layer being grown over the twin plane defects; and
after epitaxially growing the capping layer, forming a gate structure on the capping layer, wherein the gate structure is in contact with at least a portion of the fin exposed by the capping layer.

18. The method of claim 17 further comprising:
forming a source region in the fin; and
forming a drain region in the fin, the gate structure being interposed between the drain region and the source region, the capping layer extending across the top surface of the fin from the source region to the drain region.

19. The method of claim 17, wherein a portion of the capping layer distal the substrate has a thickness greater than a portion of the capping layer proximal the substrate.

20. The method of claim 19, wherein the capping layer has a thickness from 2 nm to 6 nm.

* * * * *